(12) United States Patent
Nakamura et al.

(10) Patent No.: US 6,825,723 B2
(45) Date of Patent: Nov. 30, 2004

(54) LOW NOISE GAIN-CONTROLLED AMPLIFIER

(75) Inventors: Yoshiaki Nakamura, Kanagawa (JP); Jiangin Wang, Kanagawa (JP)

(73) Assignee: NEC Compound Semiconductor Devices, Ltd. (JP)

(*) Notice: Subject to any disclaimer, the term of this patent is extended or adjusted under 35 U.S.C. 154(b) by 0 days.

(21) Appl. No.: 10/444,256

(22) Filed: May 23, 2003

(65) Prior Publication Data

US 2003/0218505 A1 Nov. 27, 2003

(30) Foreign Application Priority Data

May 24, 2002 (JP) ........................................ 2002-150946

(51) Int. Cl.[7] ............................................... H03F 3/45
(52) U.S. Cl. ..................................... 330/254; 330/311
(58) Field of Search ............................... 330/254, 278, 330/285, 311

(56) References Cited

U.S. PATENT DOCUMENTS 5,923,217 A * 7/1999 Durec ......................... 330/311
6,331,804 B1 * 12/2001 Shimizu et al. ............. 330/285
6,724,259 B2 * 4/2004 Tanabe ........................ 330/285

FOREIGN PATENT DOCUMENTS

| JP | 11-068471 | 3/1999 | ............. H03F/1/32 |
| JP | 2000-101371 | 4/2000 | ............. H03G/3/10 |
| JP | 2000-278061 | 10/2000 | ............. H03G/3/10 |

* cited by examiner

Primary Examiner—Khanh Van Nguyen
(74) Attorney, Agent, or Firm—Hayes Soloway P.C.

(57) ABSTRACT

In a gain-controlled amplifier, first, second and third transistors are provided, and a signal at one of input and output terminals is compared with a threshold voltage. When the compared signal is lower than the threshold, the second and third transistors are respectively turned into conducting and non-conducting states, and when the compared signal is higher than the threshold, the situation is in reverse. When the third transistor is non-conducting, the first and second transistors are configured to form a cascode amplifier between the input and output terminals to produce a low-noise, high-gain output signal. When the second transistor is non-conducting, the first and third transistors are configured so that the third transistor forms a base-grounded amplifier between the input and output terminals and the first transistor forms a diode for supplying a DC bias current to the third transistor to produce a low-distortion, low-gain output signal.

6 Claims, 5 Drawing Sheets

LOW NOISE GAIN-CONTROLLED AMPLIFIER

BACKGROUND OF THE INVENTION

1. Field of the Invention

The present invention relates to gain-controlled amplifiers, and more specifically to a dual mode gain-controlled amplifier.

2. Description of the Related Art

A prior art variable gain amplifier, as shown in FIG. 1, comprises transistors 101 to 105. When a bias voltage $V_B$ is higher than a bias voltage $V_A$ and the transistor 105 is non-conducting, the other transistors operate as a cascode amplifier. As a result, the variable gain amplifier operates in a high gain mode. When the voltage $V_B$ is lower than the voltage $V_A$, the transistor 105 is conducting and the transistor 101 operates as an amplifier. The signal amplified by transistor 101 is bypassed through a Vcc line (AC ground) and the variable gain amplifier operates in a low gain mode. Usually, when the signal at the input terminal 108 is high, the prior art variable gain amplifier is set in the low gain mode to prevent distortion. However, if the input signal is higher than a designed critical value of the low gain mode, the high input voltage will cause transistors 101 and 102 to produce distorted collector currents. Although part of the distorted collector currents is bypassed through the AC grounded circuit, the remaining current will cause a distorted voltage to appear at the output terminal 109.

According to Japanese Patent Publication 2000-278061, a prior art variable gain amplifier comprises a cascode amplifier, first to fourth transistors, an emitter resistance and a bias switching circuit. The cascode amplifier is connected to the collector of the emitter-grounded first transistor and to the emitter of the second transistor whose base is RF-coupled to ground through a first ground capacitance. The third transistor has its base RF-coupled to ground through a second ground capacitance, has its emitter connected to the base of the first transistor and has its collector connected to the collector of the second transistor. The fourth transistor, connected to the emitter of the third transistor, operates as a constant current source. The emitter resistance is used to connect the emitter of the fourth transistor to ground. The bias switching circuit is used to supply bias voltage to the base of each of the first to fourth transistors. By using the turn-off condition of the first transistor and the bias switching circuit, the cascode amplifier is operated for high gain operation and the third transistor is used for low gain operation.

Japanese Patent Publication 2000-101371 discloses another variable gain amplifier which is a cascode amplifier in which the collectors of emitter-grounded first and second transistors are connected to the emitter of a third transistor whose base is RF-coupled to ground. The variable gain amplifier is further provided with a feedback resistance, a bias switching circuit, a first impedance compensating circuit and a second impedance compensating circuit. Via the feedback resistance, the emitter of the second transistor is connected to ground. The bias switching circuit selects one of the first and second transistors for supplying a bias voltage. The first impedance compensating circuit controls the input of the second transistor and the second impedance compensating circuit is connected tot he base of each of the first and second transistors.

Japanese Patent Publication 1999-68471 discloses a transistor amplifier comprising an emitter-grounded input transistor and a pre-distortion circuit connected to the base of the input transistor. The pre-distortion circuit includes a base-emitter coupling and a semiconductor coupling whose direction of current is opposite to that the base-emitter coupling.

Therefore, there exists a need to provide a low-noise gain-controlled amplifier for producing a low-noise, high-gain output signal when one of the input and output signals is low and a low-distortion, low-gain output signal when one of such signals is high.

SUMMARY OF THE INVENTION

It is therefore an object of the present invention to provide a low-noise gain-controlled amplifier capable of producing a low-noise, high-gain output signal when the amplifier is set in a high gain mode, and a low-distortion, low-gain output signal when the amplifier is set in a low gain mode.

According to a first aspect of the present invention, there is provided a gain-controlled amplifier comprising an input terminal for receiving an input signal, an output terminal for delivering an output signal, first, second and third transistors, and control circuitry. The control circuitry compares one of the input and output signals with a predetermined value and causing the second and third transistors to be respectively turned into conducting and non-conducting states when the compared signal is lower than the predetermined value, and respectively turned into non-conducting and conducting states when the compared signal is higher than the predetermined value. When the third transistor is turned into the non-conducting state, the first and second transistors are configured to form a cascode amplifier between the input and output terminals. When the second transistor is turned into the non-conducting state, the first and third transistors being configured so that the third transistor forms a base-grounded amplifier between the input and output terminals and the first transistor forms a diode for supplying a DC bias current to the third transistor.

According to a second aspect of the present invention, there is provided a gain-controlled amplifier comprising first and second input terminals, second input and output terminals, first to sixth transistors. The second and fifth transistors are connected together to form a first transistor pair, and the third and sixth transistors are connected together to form a second transistor pair. Control circuitry is provided for comparing a signal at one of the first input and first output terminals with a predetermined value and comparing a signal at one of the second input and second output terminals with the predetermined value. The control circuitry causes the first and second transistor pairs to be respectively turned into conducting and non-conducting states when at least one of the compared signals is lower than the predetermined value and respectively turned into non-conducting and conducting states when both of the compared signals are higher than the predetermined value. When the second transistor pair is turned into the non-conducting state, the first and second transistors are configured to form a first cascode amplifier between the first input and output terminals and the fourth and fifth transistors are configured to form a second cascode amplifier between the second input and output terminals. When the first transistor pair is turned into the non-conducting state, the first and third transistors are configured so that the third transistor forms a first base-grounded amplifier between the first input and output terminals and the first transistor forms a first diode for supplying a DC bias current to the third transistor. Simultaneously, the fourth and sixth transistors are configured so that the sixth transistor forms a second base-grounded amplifier between the second input and output terminals and the fourth transistor forms a second diode for supplying a DC bias current to the sixth transistor.

BRIEF DESCRIPTION OF THE DRAWINGS

The present invention will be described in detail further with reference to the following drawings, in which.

DETAILED DESCRIPTION

Figure 1:
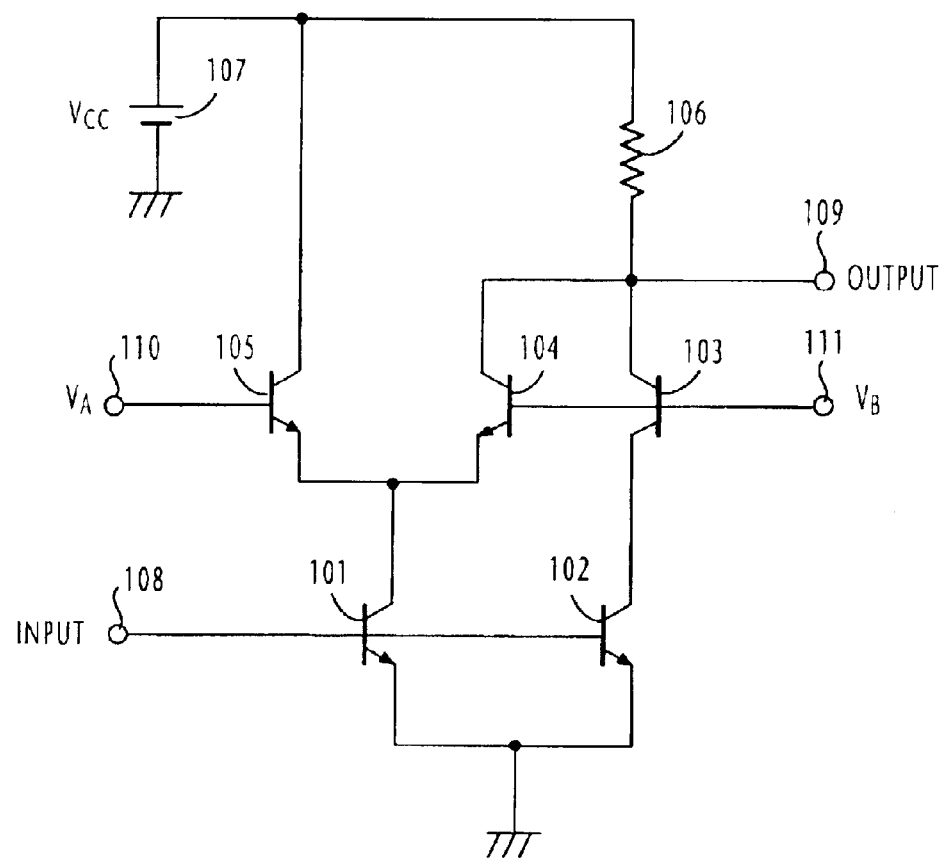
FIG. 1 is a circuit diagram of a prior art variable gain amplifier.
Figure 2:
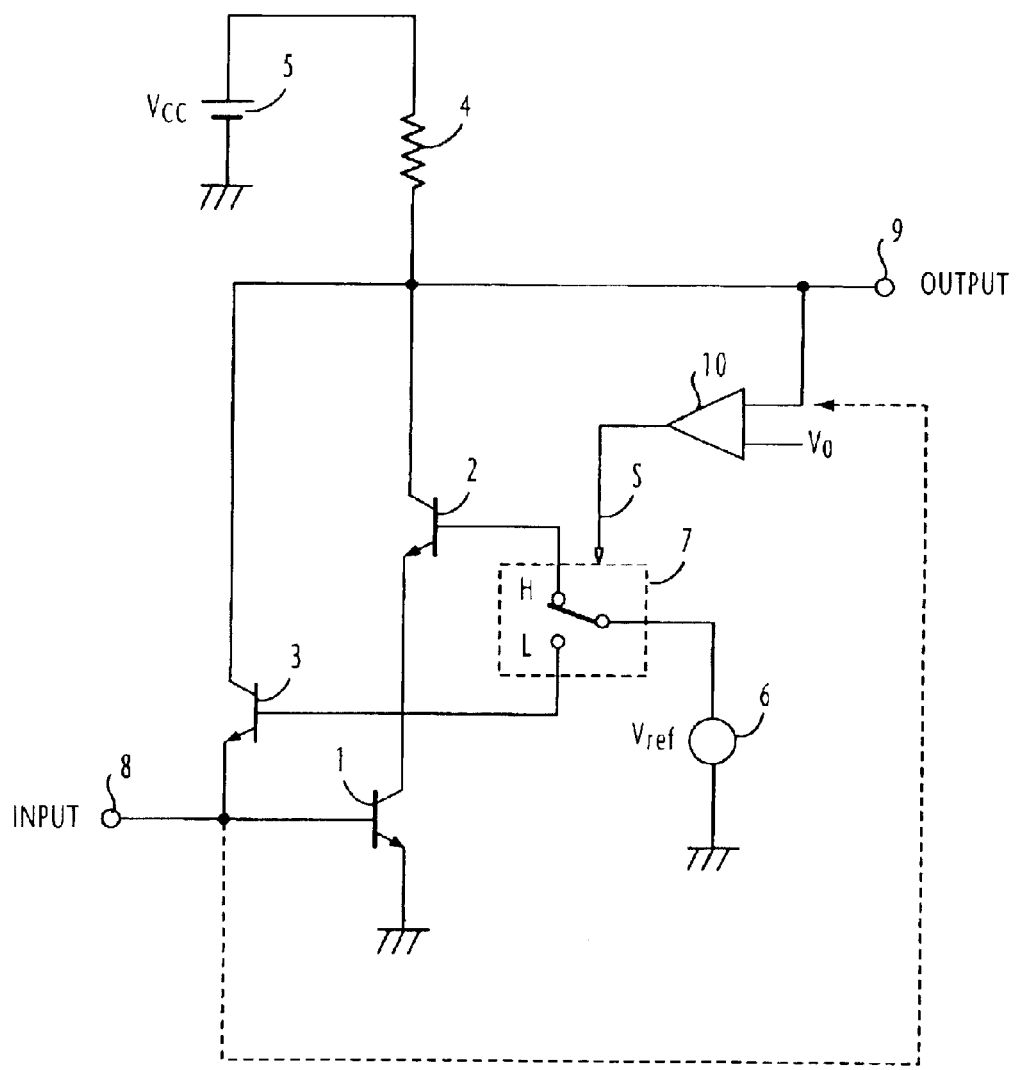
FIG. 2 is a circuit diagram of a variable gain amplifier according to one embodiment of the present invention.

Referring to FIG. 1, there is shown a variable gain amplifier of the present invention. The variable gain amplifier comprises transistors 1, 2 and 3, a switch 7 and a comparator 10.

Transistor 1 has its emitter connected to ground and has its collector connected to the emitter of the transistor 2. The base of transistor 1 is connected to an input terminal 8 and to the emitter of transistor 3. Transistor 2 has its base connected to a high-gain output terminal H of the switch 7. Transistor 3 has its base connected to a low-gain output terminal L of the switch 7. The collectors of transistors 2 and 3 are connected together to an output terminal 9 and further connected through an output resistance 4 to a power voltage source 5.

A bias voltage is supplied from a voltage source 6 to the input terminal of switch 7. This bias voltage is higher than twice the base-emitter voltage $V_{BE}$ of each of transistors 1 to 3 (or higher than the sum of the base-emitter voltages $V_{BE}$ of transistors 1 and 2).

Comparator 10 compares the signal at the output terminal 9 or the signal (as indicated by a dotted line) at the input terminal 8 with a predetermined threshold voltage $V_0$ and generates a binary "1" when the compared signal is lower than the threshold voltage or a binary "0" when the compared signal is higher than the threshold voltage. The binary output signal of comparator 10 is supplied to the switch 7 as a switching control signal. When the comparator output is "1", the switch 7 is positioned to the high-gain output terminal H to exclusively supply the bias voltage to the base of transistor 2 and when the comparator output is "0", the switch 7 is positioned to the low-gain output terminal L to exclusively supply the bias voltage to the base of transistor 3.

Figure 3:
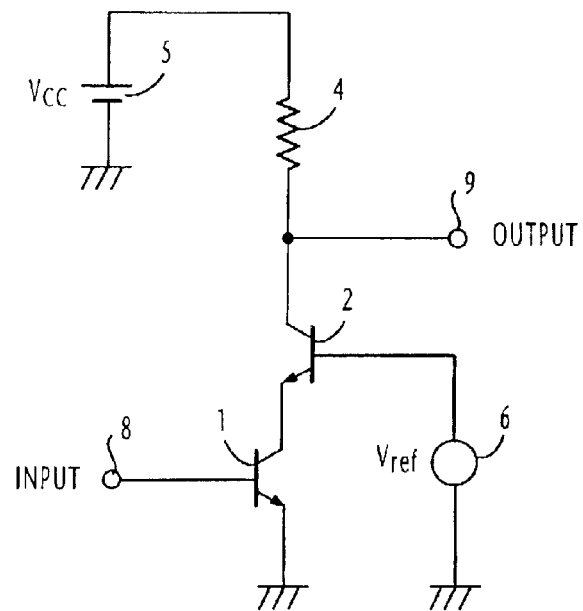
FIG. 3 is an equivalent circuit of the variable gain amplifier of FIG. 2 when operating in one of two modes.

Therefore, when the compared signal is lower than the threshold voltage $V_0$, the transistor 2 is rendered conductive, while the transistor 3 is non-conducting. Under this condition, the transistors 1 and 2 constitute a cascode amplifier between the input and output terminals 8 and 9 as shown in FIG. 3 and the variable gain amplifier operates in a high gain mode. Since the transistor 3 can be treated as non-existent, this circuit arrangement saves circuit designers concerns about parasitic capacitances which would otherwise arise when the collector of a separate transistor is connected to the base of transistor 1. Noise figure is significantly improved. Thus, the input signal at the terminal 8 is amplified by the cascode amplifier, and appears at the output terminal 9 as a low-noise, high-gain output signal.

Figure 4:
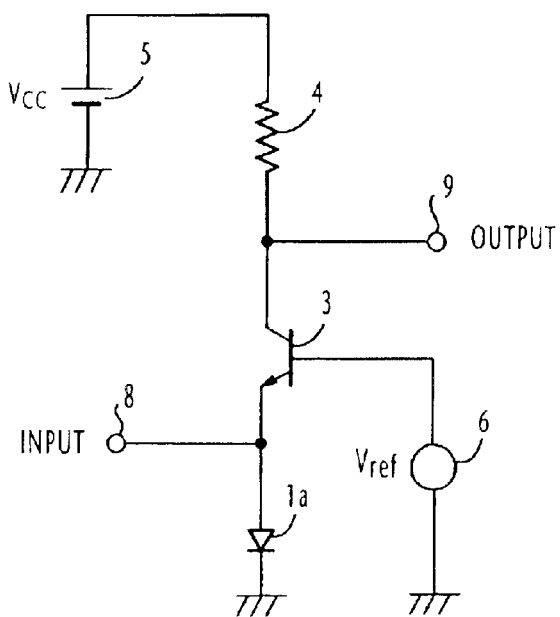
FIG. 4 is an equivalent circuit of the variable gain amplifier of FIG. 2 when operating in the other mode.

On the other hand, when the compared signal is higher than the threshold voltage $V_0$, the transistor 2 is non-conducting and the transistor 3 conducting. Under this condition, the transistor 3 constitutes a base-grounded amplifier between the input and output terminals 8 and 9, as shown in FIG. 4, and the transistor 1 functions as a diode as indicated by numeral 1a. By functioning as a diode 1a, the transistor 1 supplies a DC bias current to the base-grounded amplifying transistor 3. Since the base-to-ground impedance of transistor 1 is low due to its diode function, the input impedance of the base-grounded amplifier transistor 3 is significantly reduced. This causes the effective power of a high power input signal to be reduced significantly and the variable gain amplifier operates in a low gain mode. The distortion characteristic of the variable gain amplifier is improved in this manner.

The following is a description of a second embodiment of the present invention in which the variable gain amplifier of this invention is modified in the form of a differential amplifier.

Figure 5:
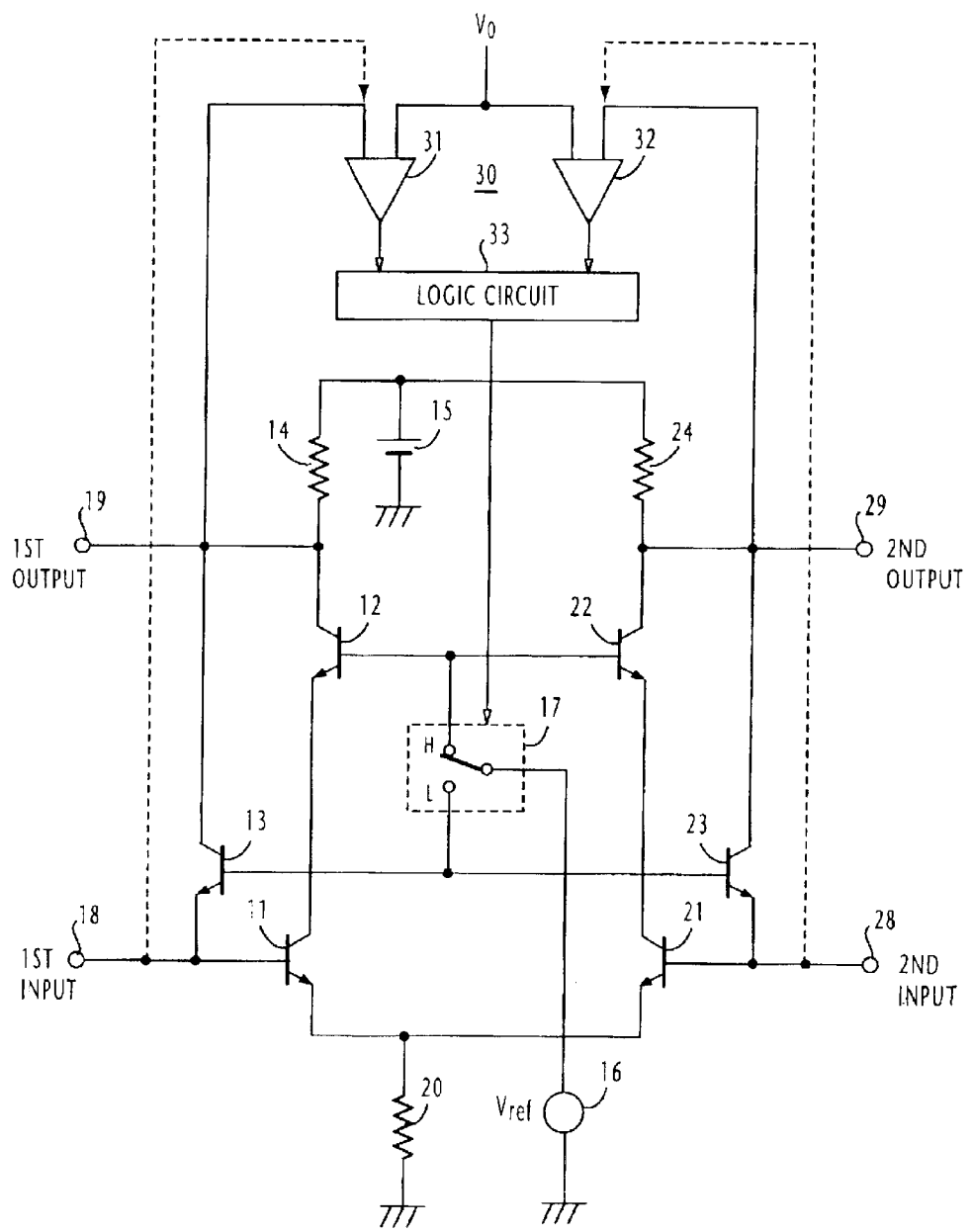
FIG. 5 is circuit diagram of a differential amplifier according to a second embodiment of the present invention, implemented by using the variable gain amplifier of the previous embodiment.

In FIG. 5, a differential amplifier of this invention comprises transistors 11 to 13 and 21 to 23, a switch 17, and a control circuit 30 including comparators 31, 32 and a logic circuit 33.

Transistors 11, 12 and 13 form a first group of transistors and transistors 21, 22 and 23 form a second group of transistors configured in a similar manner to the configuration of the first group. The first group of transistors is associated with a first input terminal 18 and a first output terminal 19 and the second group with a second input terminal 28 and a second output terminal 29.

The transistors of each group are configured in a manner similar to the transistors of the previous embodiment. In the first group, the transistor 11 has its emitter connected to ground through a resistor 20 and has its collector connected to the emitter of the transistor 12. The base of transistor 11 is connected to the first input terminal 18 and to the emitter of transistor 13. Transistor 12 has its base connected to a high-gain output terminal H of the switch 17. Transistor 13 has its base connected to a low-gain output terminal L of the switch 17. The collectors of transistors 12 and 13 are connected together to the first output terminal 19 and further connected through an output resistance 14 to a power voltage source 15.

In the second group, the transistor 21 has its emitter connected to ground through resistor 20 and has its collector connected to the emitter of the transistor 22. The base of transistor 21 is connected to the second input terminal 28 and to the emitter of transistor 23. Transistor 22 has its base connected to the high-gain output terminal H of switch 17. Transistor 23 has its base connected to the low-gain output terminal L of switch 17. The collectors of transistors 22 and 23 are connected together to the second output terminal 29 and further connected through an output resistance 24 to the power voltage source 15.

Transistors 12 and 22 form a first transistor pair to be simultaneously turned into a conducting or a non-conducting state under control of the switch 17 and transistors 13 and 23 form a second transistor pair to be simultaneously turned into a conducting or a non-conducting state under control of the switch 17 in a mutually exclusive manner.

Switch 17 is responsive to a switching control signal from the control circuit 30 for supplying a bias voltage from a voltage source 16 to the base of the first pair of transistors 12, 22 or the base of the second pair of transistors 13 and 23.

Comparator 31 makes a comparison between the signal at one of the first input terminal 18 and the first output terminal 19 with a threshold voltage $V_0$ and produces a first comparator output signal when the compared signal is lower than the threshold voltage. Comparator 32 makes a comparison between the signal at one of the second input terminal 28 and the second output terminal 29 with the threshold voltage $V_0$ and produces a second comparator output signal when the compared signal is lower than the threshold voltage. The outputs of comparators 31 and 32 are supplied to the logic circuit 33. Logic circuit 33 produces a binary "1" when at least one of the comparator outputs is present and a low-gain switching signal when both of the comparator outputs are absent. The binary "1" is supplied to the switch 17 as a high-gain switching signal and the binary "0" as a low-gain switching signal.

In response to the high-gain switching signal, the switch 17 is positioned to the high-gain output terminal H and causes the first transistor pair (12, 22) and second transistor pair (13, 23) to be respectively turned into conducting and non-conducting states. In response to the low-gain switching signal, the switch 17 is positioned to the low-gain output terminal L and causes the first transistor pair (12, 22) and second transistor pair (13, 23) to be respectively turned into non-conducting and conducting states.

Figure 6:
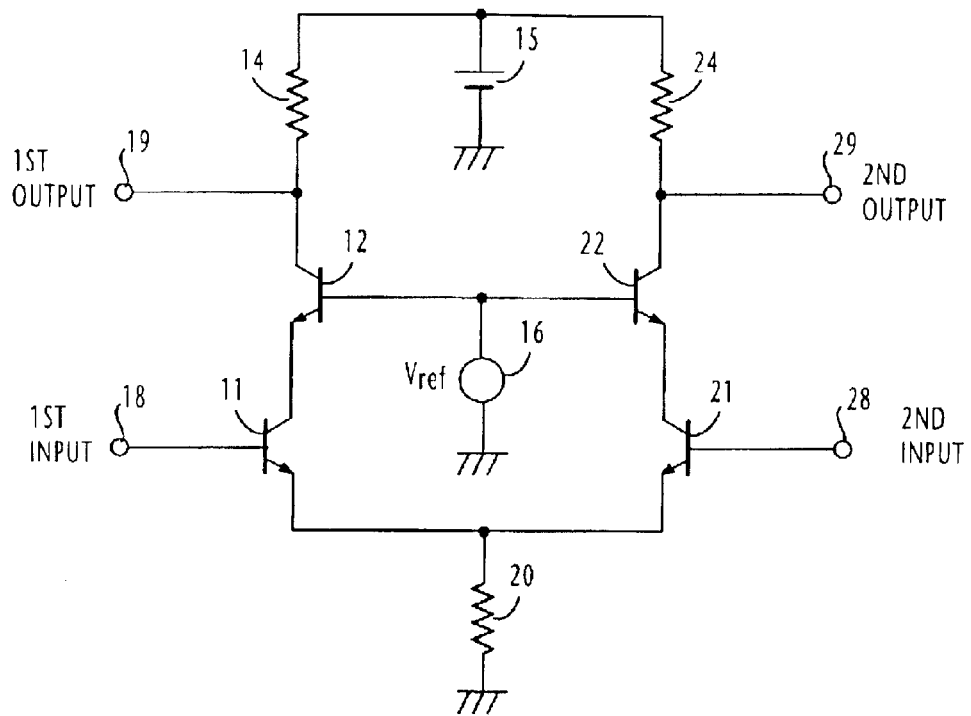
FIG. 6 is an equivalent circuit of the differential amplifier of FIG. 5 when operating in one of two modes.
Figure 7:
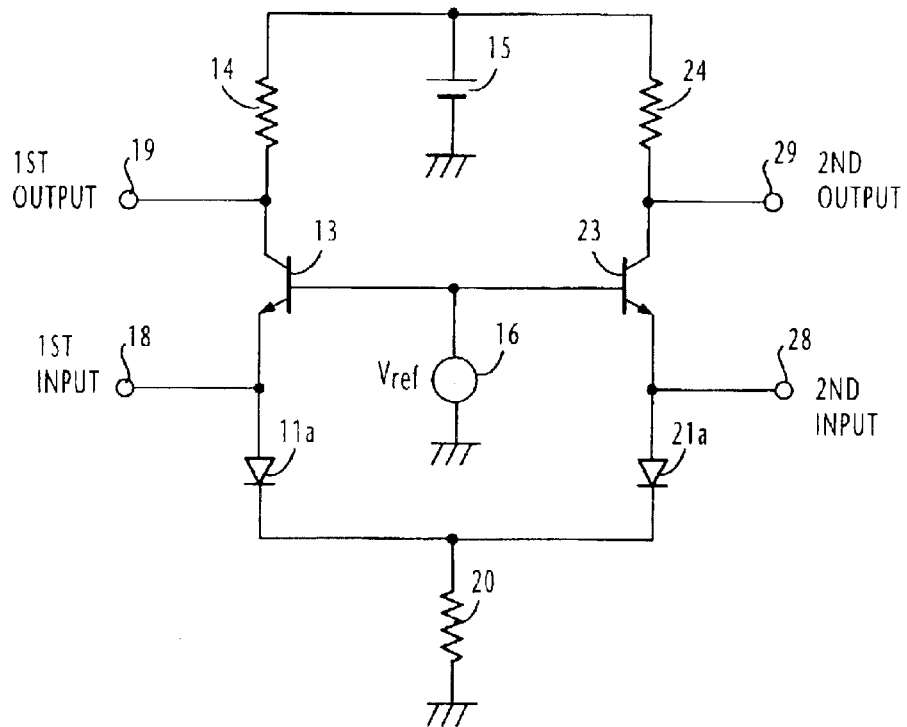
FIG. 7 is an equivalent circuit of the differential amplifier of FIG. 5 when operating in the other mode.

FIG. 6 represents an equivalent circuit of FIG. 5 when the differential amplifier operates in a high gain mode, and FIG. 7 represents an equivalent circuit when the differential amplifier operates in a low gain mode.

When the signal at least one of the signals compared by the comparators 31 and 32 is lower than $V_0$, a high-gain switching signal is supplied from the logic circuit 33 to the switch 17, and the differential amplifier is represented as shown in FIG. 6. When both of the compared signals are higher than $V_0$, a low-gain switching signal is supplied from the logic circuit 33 to the switch 17 the differential amplifier is represented as shown in FIG. 7.

When the switch 17 is positioned to the high-gain output terminal H, the transistors 12 and 22 are conducting and the transistors 13 and 23 are non-conducting. Under this condition, the transistors 11 and 12 are configured to form a first cascode amplifier between the first input terminal 18 and the first output terminal 19 and the transistors 21 and 22 constitute a second cascode amplifier between the second input terminal 28 and the second output terminal 29, as shown in FIG. 6 and the differential amplifier operates in a high gain mode.

Since the transistors 13 and 23 can be treated as non-existent, this circuit arrangement saves circuit designers concerns about parasitic capacitances which would otherwise arise when the collector of a separate transistor is connected to the base of transistors 11 and 21. Noise figure is significantly improved. Thus, the signals at the input terminals 18 and 28 are amplified by the cascode amplifiers, and appear at the output terminals 19 and 29 as low-noise, high-gain output signals.

On the other hand, when both of the compared signals are higher than the threshold voltage $V_0$, the first transistor pair (12, 22) is non-conducting and the second transistor pair (13, 23) conducting. Under this condition, the transistor 13 constitutes a first base-grounded amplifier between the first input and first output terminals 18 and 19, and the transistor 23 constitutes a second base-grounded amplifier between the second input and second output terminals 28 and 29, as shown in FIG. 7, and each of the transistors 11 and 21 functions as a diode as indicated by numerals 11a and 21a. By functioning as a diode, the transistors 11 and 21 supply a DC bias current to the base-grounded amplifying transistors 13 and 23. Since the base-to-ground impedance of each of transistors 11 and 21 is low due to its diode function, the input impedance of the base-grounded amplifier transistors 13 and 23 is significantly reduced. This causes the effective power of a high power input signal to be reduced significantly and the differential amplifier operates in a low gain mode. The distortion characteristic of the differential amplifier is improved in this manner.

What is claimed is:

1. A gain-controlled amplifier comprising:
   an input terminal for receiving an input signal;
   an output terminal for delivering an output signal;
   a first transistor;
   a second transistor;
   a third transistor; and
   control circuitry for comparing one of said input and output signals with a predetermined value and causing said second and third transistors be respectively turned into conducting and non-conducting states when the compared signal is lower than the predetermined value, and respectively turned into non-conducting and conducting states when the compared signal is higher than the predetermined value,
   said first and second transistors being configured to form a cascode amplifier between said input and output terminals when said third transistor is turned into said non-conducting state,
   said first and third transistors being configured so that the third transistor forms a base-grounded amplifier between said input and output terminals and said first transistor forms a diode for supplying a DC bias current to the third transistor when said second transistor is turned into said non-conducting state.

2. The gain-controlled amplifier of claim 1, wherein said control circuitry comprises:
   a comparator for comparing one of said input and output signals with said predetermined value for producing a comparator output signal when the compared signal is lower than the predetermined value; and
   a switch for causing said first and second transistors to be respectively turned into conducting and non-conducting states when said comparator output signal is present and respectively turned into non-conducting and conducting states when said comparator output signal is absent.

3. The gain-controlled amplifier of claim 1,
   wherein said first transistor has its emitter connected to ground, has its collector connected to the emitter of said second transistor, and has its base connected to said input terminal and to the emitter of said third transistor,
   wherein said second transistor has its emitter connected to the collector of said first transistor and has its collector connected to the collector of said third transistor and to said output terminal, and
   wherein said third transistor has its emitter connected to said input terminal and to the base of said first transistor and has its collector to said output terminal and to the collector of said second transistor.

4. A gain-controlled amplifier comprising:

a first input terminal for receiving a first input signal;

a second input terminal for receiving a second input signal;

a first output terminal for delivering a first output signal;

a second output terminal for delivering a second output signal;

a first transistor;

a second transistor;

a third transistor;

a fourth transistor;

a fifth transistor, said second and fifth transistors being connected together to form a first transistor pair;

a sixth transistor, said third and sixth transistors being connected together to form a second transistor pair; and control circuitry for comparing one of said first input and first output signals with a predetermined value and comparing one of said second input and second output signals with said predetermined value, and causing said first and second transistor pairs to be respectively turned into conducting and non-conducting states when at least one of the compared signals is lower than said predetermined value and respectively turned into non-conducting and conducting states when both of the compared signals are higher than said predetermined value, said first and second transistors being configured to form a first cascode amplifier between said first input and output terminals and said fourth and fifth transistors being configured to form a second cascode amplifier between said second input and output terminals, when said second transistor pair is turned into said non-conducting state, said first and third transistors being configured so that the third transistor forms a first base-grounded amplifier between said first input and output terminals and said first transistor forms a first diode for supplying a DC bias current to the third transistor, and said fourth and sixth transistors being configured so that the sixth transistor forms a second base-grounded amplifier between said second input and output terminals and said fourth transistor forms a second diode for supplying a DC bias current to the sixth transistor, when said first transistor pair is turned into said non-conducting state.

5. The gain-controlled amplifier of claim 4, wherein said control circuitry comprises:

a first comparator for comparing one of said first input and output signals with said predetermined value for producing a first comparator output signal when the compared signal is lower than the predetermined value;

a second comparator for comparing one of said second input and output signals with said predetermined value for producing a second comparator output signal when the compared signal is lower than the predetermined value;

logic circuitry for producing a high-gain switching signal when at least one of said first and second comparator outputs is present and a low-gain switching signal when both of said first and second comparator outputs are absent; and a switch for causing said first and second transistor pairs to be respectively turned into conducting and non-conducting states in response to said high-gain switching signal and respectively turned into non-conducting and conducting states in response to said low-gain switching signal.

6. The gain-controlled amplifier of claim 4, wherein said first transistor has its emitter connected to ground through a resistor and the emitter of said fourth transistor, has its collector connected to the emitter of said second transistor and has its base connected to said first input terminal and to the emitter of said third transistor, wherein said second transistor has its emitter connected to the collector of said first transistor, has its collector connected to the collector said third transistor and to said first output terminal, and has its base connected to the base of said fifth transistor, wherein said third transistor has its emitter connected to said first input terminal and to the base of said first transistor, has its collector connected to said first output terminal and the collector of said second transistor, and has its base connected to said switch and to the base of said sixth transistor, wherein said fourth transistor has its emitter connected to ground through said resistor and to the emitter of said first transistor, has its connected to the emitter of said fifth transistor, and has its base connected to said second input terminal and to the emitter of said sixth transistor, wherein said fifth transistor has its emitter connected to the collector of said fourth transistor, has its collector connected to the collector of said sixth transistor and to a second output terminal, and has its base connected to the base of said second transistor, and wherein said sixth transistor has its emitter connected to said second input terminal and to the base of said fourth transistor, has its collector connected to said second output terminal and to the collector of said fifth transistor, and has its base connected to the base of said third transistor.

* * * * *